(12) United States Patent
Huang et al.

(10) Patent No.: US 10,755,008 B2
(45) Date of Patent: Aug. 25, 2020

(54) CIRCUIT COMPARING METHOD AND ELECTRONIC DEVICE

(71) Applicant: PEGATRON CORPORATION, Taipei (TW)

(72) Inventors: Yu-Jen Huang, Taipei (TW); Tien-Yun Kuo, Taipei (TW); Yi-Hua Chen, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/026,076

(22) Filed: Jul. 3, 2018

(65) Prior Publication Data

US 2019/0005179 A1 Jan. 3, 2019

(30) Foreign Application Priority Data

Jul. 3, 2017 (TW) .............................. 106122274 A

(51) Int. Cl.
*G06F 30/33* (2020.01)
*G06F 30/30* (2020.01)
(Continued)

(52) U.S. Cl.
CPC .............. *G06F 30/30* (2020.01); *G06F 30/33* (2020.01); *G06F 30/3323* (2020.01);
(Continued)

(58) Field of Classification Search
CPC . Y02B 20/42; Y02B 70/3216; G06F 12/0207; G06F 12/04; G06F 12/0607; G06F 13/16; G06F 13/1673; G06F 13/1689; G06F 13/28; G06F 9/3867; G06F 9/4494; G06F 3/017; G06F 3/03545; G06F 1/163; G06F 3/00; G06F 3/0321; G06F 2119/12; G06F 21/32; G06F 21/34; G06F 21/73; G06F 2221/2153; G06F 30/3312; G06F 30/398; G06F 3/011; G06F 3/03547;
(Continued)

(56) References Cited

U.S. PATENT DOCUMENTS

2001/0034875 A1* 10/2001 Nakayama .......... G06F 17/5068
716/122
2011/0167399 A1* 7/2011 Schroeder ........... G06F 17/5045
716/122

(Continued)

FOREIGN PATENT DOCUMENTS

CN 104091161 A 10/2014
TW 200629809 A 8/2006
TW 201021050 A 6/2010

*Primary Examiner* — Binh C Tat
(74) *Attorney, Agent, or Firm* — McClure, Qualey & Rodack, LLP

(57) ABSTRACT

A circuit comparing method includes the following operations: detecting several connection relationships between all starting points and all ending points corresponding to all starting points of a first circuit diagram; detecting several connection relationships between all starting points and all ending points corresponding to all starting points of a second circuit diagram; determining at least one difference between several connection relationships of the first circuit diagram and several connection relationships of the second circuit diagram; and outputting the at least one difference.

12 Claims, 5 Drawing Sheets

(51) Int. Cl.
   *G06F 30/398* (2020.01)
   *G06F 30/3323* (2020.01)
   *G01R 31/28* (2006.01)
   *G06F 30/394* (2020.01)

(52) U.S. Cl.
   CPC ........ *G06F 30/398* (2020.01); *G01R 31/2832* (2013.01); *G06F 30/394* (2020.01)

(58) Field of Classification Search
   CPC ........ G06F 3/0416; G06F 3/042; G06F 3/044; G06F 19/00; G06F 3/013; G06F 3/016; G06F 3/0346; H04N 19/423; H04N 1/00968; H04N 2201/3226; H04N 2201/3247; G06K 9/6205
   USPC .................................................. 716/104–113
   See application file for complete search history.

(56) References Cited

U.S. PATENT DOCUMENTS

| | | | |
|---|---|---|---|
| 2012/0192140 A1* | 7/2012 | Sadamatsu | G06F 30/39 716/137 |
| 2013/0125072 A1* | 5/2013 | Newcomb | G06F 30/30 716/107 |

* cited by examiner

US 10,755,008 B2

CIRCUIT COMPARING METHOD AND ELECTRONIC DEVICE

CROSS-REFERENCE TO RELATED APPLICATION

This application claims the priority benefit of Taiwan Application serial no. 106122274, filed Jul. 3, 2017, the full disclosure of which is incorporated herein by reference.

BACKGROUND

Technical Field

The present disclosure relates to a circuit comparing method and an electronic device. More particularly, the present disclosure relates to a circuit comparing method and an electronic device for comparing the connection relationships between elements.

Description of Related Art

With more and more functions provided by electronic products and more and more complex circuit designs, the circuit diagram will undergo several revisions during the design of the circuit. In addition, in the process of designing products, it is often necessary to cooperate with other companies. The circuit diagrams of different companies may also differ. Circuit designers need to understand the differences between the different versions of the circuit diagrams and the differences between the diagrams of different companies. However, the manual comparison of the circuit diagrams is a complicated, time-consuming and error-prone process.

Therefore, with the complexity of the design of the circuit diagram, how to compare the different design circuit diagrams more accurately, quickly, and more completely, so as to allow the circuit designer to quickly know the differences between the circuit diagrams, is a problem to be improved in the field.

SUMMARY

An aspect of the present disclosure is to provide a circuit comparing method. The circuit comparing method includes the following operations: detecting several connection relationships between all starting points and all ending points corresponding to all starting points of a first circuit diagram; detecting several connection relationships between all starting points and all ending points corresponding to all starting points of a second circuit diagram; determining at least one difference between several connection relationships of the first circuit diagram and several connection relationships of the second circuit diagram; and outputting the at least one difference.

Another aspect of the present disclosure is to provide an electronic device. The electronic device includes a memory and a processor. The memory is configured to store a first circuit diagram and a second circuit diagram. The processor is coupled to the memory and detects several connection relationships between all starting points and all ending points corresponding to all starting points of a first circuit diagram and several connection relationships between all starting points and all ending points corresponding to all starting points of a second circuit diagram, wherein the processor determines at least one difference between several connection relationships of the first circuit diagram and several connection relationships of the second circuit diagram, and to output the at least one difference.

In sum, the embodiments of the present disclosure provide a circuit comparing method and an electronic device, more particularly, a circuit comparing method and an electronic device for comparing the connection relationships between elements, so as to compare the different design circuit diagrams more accurately, quickly, and more completely, and to allow the circuit designer to quickly know the differences between the circuit diagrams.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
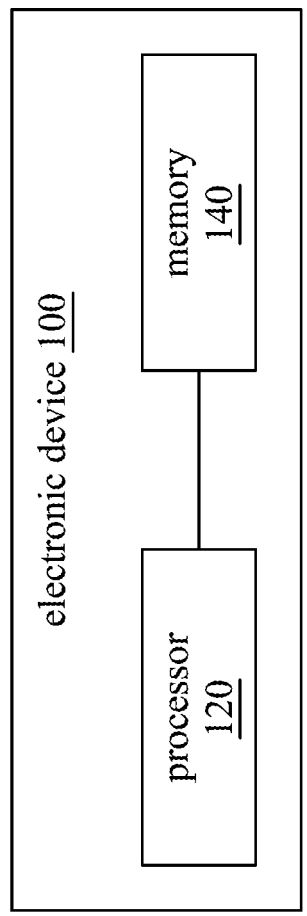
FIG. 1 is a schematic diagram of an electronic device according to some embodiments of the present disclosure.

Reference is made to FIG. 1. FIG. 1 is a schematic diagram of an electronic device 100 according to some embodiments of the present disclosure. As illustrated in FIG. 1, the electronic device 100 includes a processor 120 and a memory 140. The processor 120 is coupled to the memory 140. The memory 140 stores several circuit diagrams.

Figure 2A:
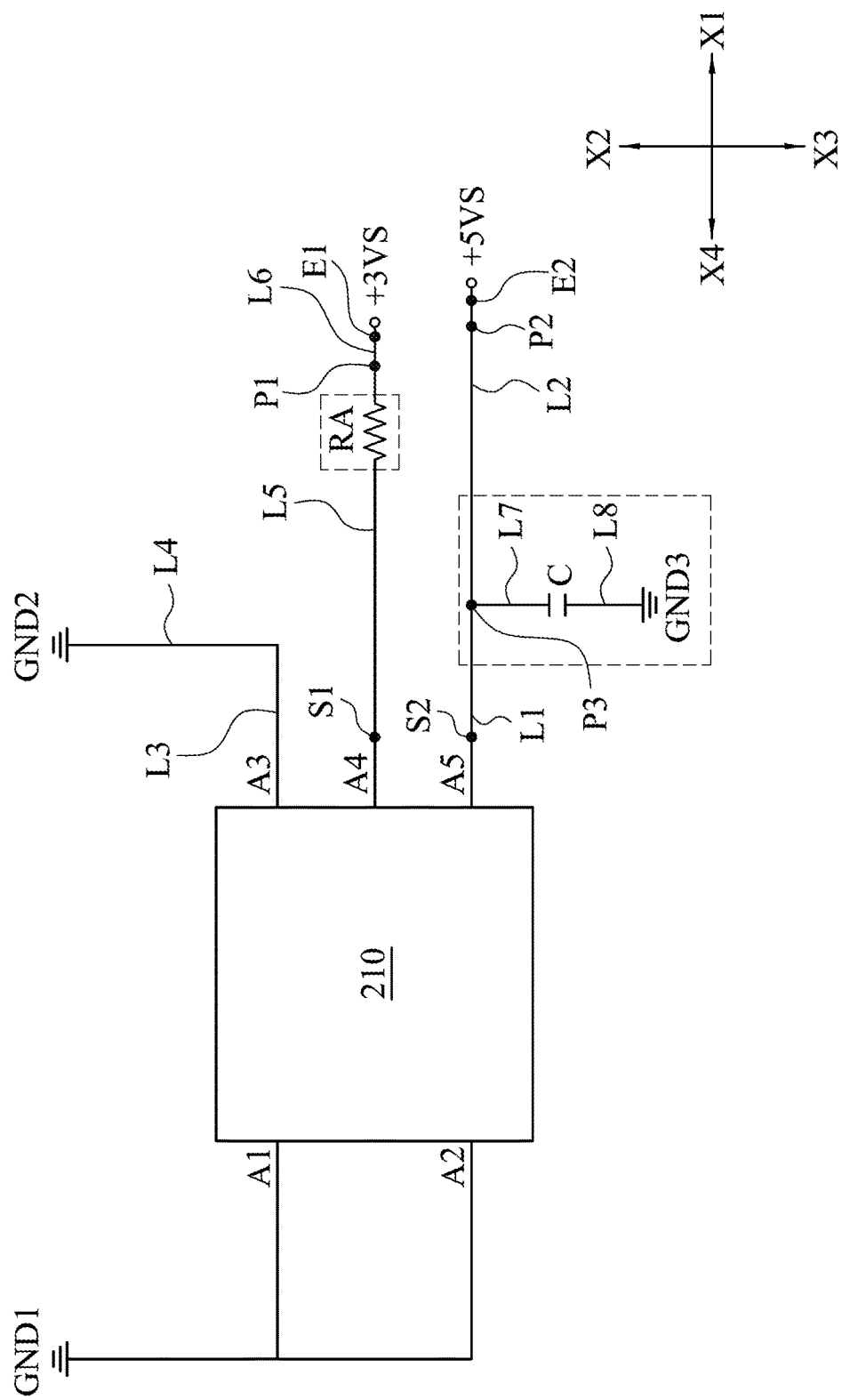
FIG. 2A is a schematic diagram of a circuit diagram according to some embodiments of the present disclosure.
Figure 2B:
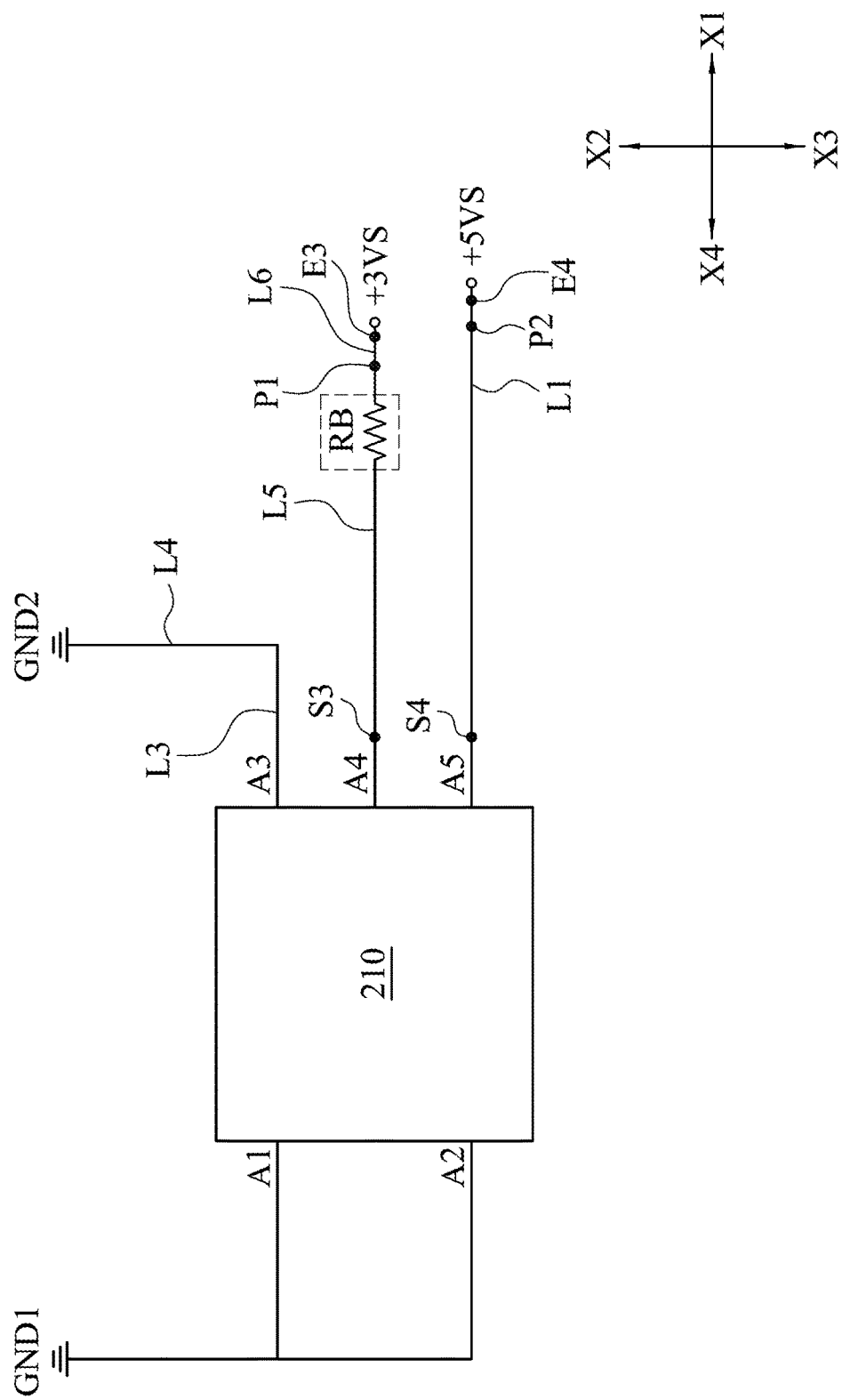
FIG. 2B is a schematic diagram of a circuit diagram according to some embodiments of the present disclosure.

Reference is made to FIG. 2A. FIG. 2A is a schematic diagram of a circuit diagram 200A according to some embodiments of the present disclosure. As illustrated in FIG. 2A, circuit diagram 200A includes several elements, and the elements connected to each other through wires. The circuit diagram 200A includes chip 210. The chip 210 includes pins A1 to A5. The pin A1 is connected to the ground point GND1 the pin A2 is connected to the ground point GND1, the pin A3 is connected to the ground point GND2. The pin A4 is connected to the resistor RA, the resistor RA is further connected to the power source +3VS. The pin A5 and the power source +5VS are connected to the capacitor C, and the capacitor C is further connected to the ground point GND3. The difference between FIG. 2B and FIG. 2A is that in FIG. 2B, the pin A5 only connects to the power source +5VS and does not connect to the power source +5VS. In some embodiments, the wires connecting each element are located on the X2 and X3 directions or on the X1 and X4 directions. In some embodiments, the X2 and X3 directions are perpendicular to the X1 and X4 directions, but the present disclosure is not limited thereto.

For illustrative purposes, Reference is made to FIG. 1, FIG. 2A and FIG. 2B at the same time.

In some embodiments, the processor 120 detects several connection relationships between all starting points and all ending points corresponding to all starting points of the first circuit diagram, detects several connection relationships between all starting points and all ending points corresponding to all starting points of the second circuit diagram, and stores the detected several connection relationships to the memory 140.

For example, the processor 120 sets several starting points and several ending points in circuit diagram 200A of FIG. 2A, and detects several connection relationships between all starting points and all ending points corresponding to all starting points of the circuit diagram 200A. The processor 120 sets several starting points and several ending points in circuit diagram 200B of FIG. 2B, and detects several connection relationships between all starting points and all ending points corresponding to all starting points of circuit diagram 200B.

In some embodiments, the starting points and the ending points may be pins of the chips, the ground points, the power sources, the bridging symbols, and so on, but the embodiments of the present disclosure are not limited thereto.

In some embodiments, the processor 120 is configured to detect a first connection relationship between a first starting point and a first ending point of the first circuit diagram, to detect a second connection relationship between a second starting point and a second ending point of the first circuit diagram. The processor 120 is further configured to detect a third connection relationship between a third starting point and a third ending point of the second circuit diagram, and to detect a fourth connection relationship between a fourth starting point and a fourth ending point of the second circuit diagram.

For example, the processor 120 sets the pin A4 of the chip 210 to be the first starting point S1, sets the power source +3VS to be the first ending point E1, sets the pin A5 of the chip 210 to be the second starting point S2, and sets the power source +5VS to be the second ending point E2 in circuit diagram 200A of FIG. 2A. The processor 120 sets pin A4 of the chip 210 to be the third starting point S3, sets the power source +3VS to be the third ending point E3, sets the pin A5 of the chip 210 to be the fourth starting point S4, and sets the power source +5VS to be the fourth ending point E4 in circuit diagram 200B of FIG. 2B. After setting several starting points and several ending points, the processor 120 detects a first connection relationship between the first starting point S1 and the first ending point E1, a second connection relationship between the second starting point S2 and the second ending point E2, the third connection relationship between the third starting point S3 and the third ending point E3, and the fourth connection relationship between the fourth starting point S4 and the fourth ending point E4. The starting points and the ending points mentioning above are for illustrative purposes only, the embodiments of the present disclosure are not limited thereto.

In some embodiments, the processor 120 sets the starting points and the ending points in the circuit diagram. Then, the processor 120 determines whether the starting points are connected to the corresponding ending points through the wires and/or the elements or not.

For example, after the processor 120 sets the pin A4 of the chip 210 to be the first starting point S1 and the power source +3VS to be the first ending point E1 in circuit diagram 200A, the processor 120 determines whether the first starting point S1 is connected to the first ending point E1 through the wires and/or the elements or not. It may be known from FIG. 2A, the first starting point S1 is connected to the first ending point E1 through the wire L5, the wire L6, and the resistor RA. In some embodiments, the elements may be resistors, capacitors, inductors, and so on, but the embodiments of the present disclosure are not limited thereto.

In some embodiments, the memory 140 stores the first connection relationship, the second connection relationship, the third connection relationship, and the fourth connection relationship. In some embodiments, the connection relationships stored in the memory 140 include all elements connected between several starting points and corresponding several ending points.

For example, pin A4 is the first starting point S1 and the power source +3VS is the first ending point E1, the memory 140 stores the first connection relationship between the first starting point S1 and the first ending point E1. The first connection relationship stored in the memory 140 includes the power source +3VS, the pin A4, and the resistor RA.

In some embodiments, the processor 120 determines at least one difference between several connection relationships of the first circuit diagram and several connection relationships of the second circuit diagram. For example, in circuit diagram 200A, pin A5 of the chip 210 is connected to the ground point GND3, and in circuit diagram 200B, pin A5 of the chip 210 is not connected to the ground point GND3. The processor 120 then determines that the differences mentioning above are existed between several connection relationships of the circuit diagram 200A and several connection relationships of the circuit diagram 200B.

In some embodiments, the processor 120 is further configured to compare whether the elements of several connection relationships of the first circuit diagram and elements of several connection relationships of the second circuit diagram are identical elements or not.

For example, after the processor 120 stores the first connection relationship between the first starting point S1 and the first ending point E1 of the circuit diagram 200A and the third connection relationship between the third starting point S3 and the third ending point E3 of the circuit diagram 200B, the processor 120 compares whether the elements of the first connection relationship and the third connection relationship are identical elements or not. As illustrated in FIG. 2A and FIG. 2B, both of the element of the first connection relationship and the element of the third connection relationship are resistors.

In some embodiments, when elements of several connection relationships of the first circuit diagram and elements of several connection relationships of the second circuit diagram are identical, the processor 120 determines whether the values of the elements of several connection relationships of the first circuit diagram and the values of the elements of several connection relationships of the second circuit diagram are equal or not.

For example, after the processor 120 stores the first connection relationship between the first starting point S1 and the first ending point E1 of the circuit diagram 200A and stores the third connection relationship between the third starting point S3 and the third ending point E3 of the circuit diagram 200B, the processor 120 compares the elements of the first connection relationship and the elements of the third connection relationship and determines whether the elements of the first connection relationship and the elements of the third connection relationship are identical elements or not. As illustrated in FIG. 2A and FIG. 2B, both of the element of the first connection relationship and the element of the third connection relationship are resistors. Then, the processor 120 determines whether the resistance value of the resistor RA of the first connection relationship and the resistance value of the resistor RB of the third connection relationship are identical or not.

In some embodiments, after the processor 120 determines the at least one difference between several connection relationships of the first circuit diagram and several connection relationships of the second circuit diagram, the processor 120 outputs the at least one difference. In some embodiments, when the processor 120 outputs the difference, the processor 120 make marks on the differences between the different circuit diagrams with colors.

For example, the differences between the circuit diagram 200A and the circuit diagram 200B includes that in circuit diagram 200A, the pin A5, the power source +5VS, and the capacitor C are connected to each other, and the capacitor C is further connected to the ground point GND3, while in circuit diagram 200B, ground point GND3 and capacitor C do not exist. The processor 120 make marks on the differences mentioning above on the circuit diagram.

In some embodiments, the processor 120 is further configured to make marks on the elements of the first circuit diagram and/or the elements of the second circuit diagram on the first circuit diagram and/or the second circuit diagram when the values of the elements of the first circuit diagram and the values of the elements of the second circuit diagram are different. For example, even in circuit diagram 200A and circuit diagram 200B, the pin A4 is connected to the power source +3VS through the resistor RA or the resistor RB, but the tolerance/resistance value of the resistor RA and the resistor RB are different. That is, the value of the resistor RA and the resistor RB are different. The processor 120 make marks on the resistor RA and/or the resistor RB of the circuit diagram 200A and/or the circuit diagram 200B.

In some embodiments, the processor 120 is further configured to make marks on several elements of the first circuit diagram and/or several elements of the second circuit diagram when several elements of the first circuit diagram and several elements of the second circuit diagram are different. For example, assume the element RA of the circuit diagram 200A is a resistor, and the element RB of the circuit diagram 200B is a capacitor, the processor 120 make marks on the element RA and/or the element RB of the circuit diagram 200A and/or the circuit diagram 200B.

For example, the range enclosed by the dotted line in FIG. 2A and FIG. 2B are the differences between the circuit diagram 200A and the circuit diagram 200B. When outputting the difference, the differences may be marked with color on the circuit diagram 200A and the circuit diagram 200B.

Figure 3:
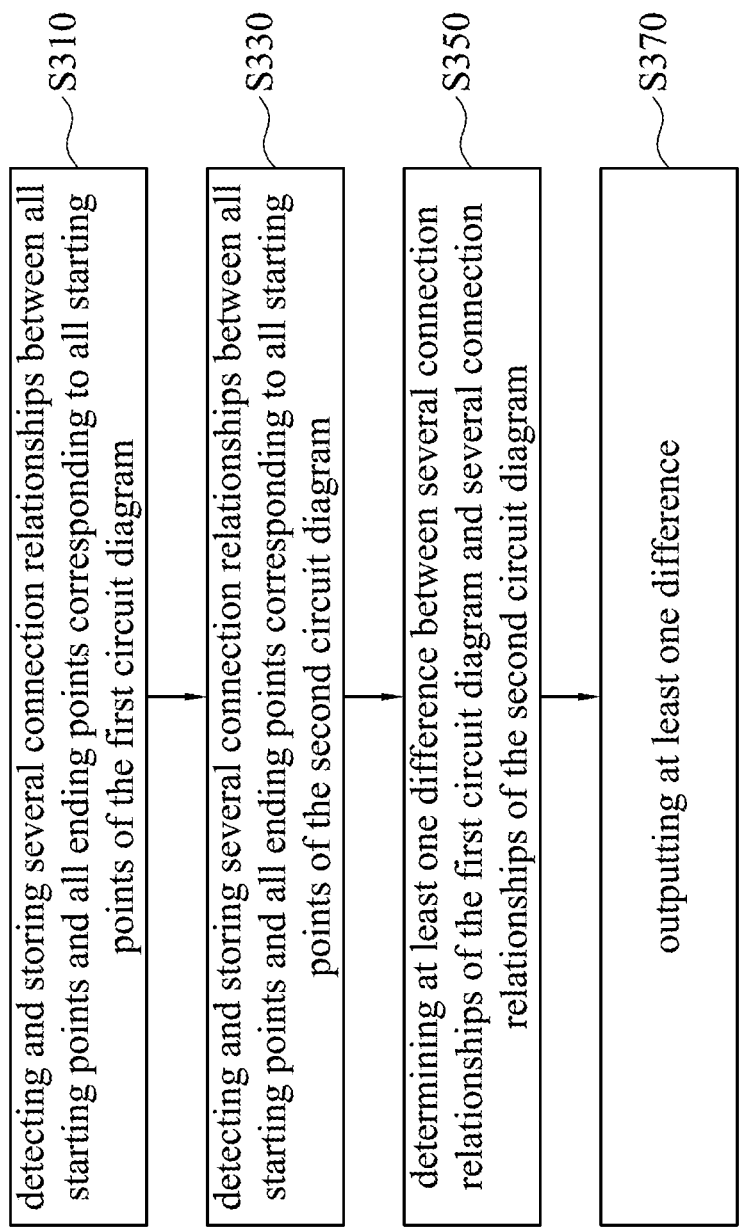
FIG. 3 is a flow chart of a circuit comparing method according to some embodiments of the present disclosure.

Reference is made to FIG. 3. FIG. 3 is a flow chart of a circuit comparing method 300 according to some embodiments of the present disclosure. As illustrated in FIG. 3, the circuit comparing method 300 includes the following operations:

Operation S310: detecting and storing several connection relationships between all starting points and all ending points corresponding to all starting points of the first circuit diagram;

Operation S330: detecting and storing several connection relationships between all starting points and all ending points corresponding to all starting points of the second circuit diagram;

Operation S350: determining at least one difference between several connection relationships of the first circuit diagram and several connection relationships of the second circuit diagram; and Operation S370: outputting at least one difference.

To make the charging method 300 of the embodiments of the present disclosure easy to understand, reference is made to FIG. 1, FIG. 2A, FIG. 2B, FIG. 3, and FIG. 4 at the same time.

In operation S310, detecting and storing several connection relationships of the first circuit diagram between all starting points and all ending points corresponding to all starting points. In some embodiments, operation S310 may be performed by the processor 120. For example, the first circuit diagram stored in the memory 140 may be read by the processor 120 of FIG. 1, and several connection relationships between all starting points and all ending points corresponding to all starting points of the first circuit diagram may be detected by the processor 120, then the processor 120 may store several connection relationships to the memory 140.

Figure 4:
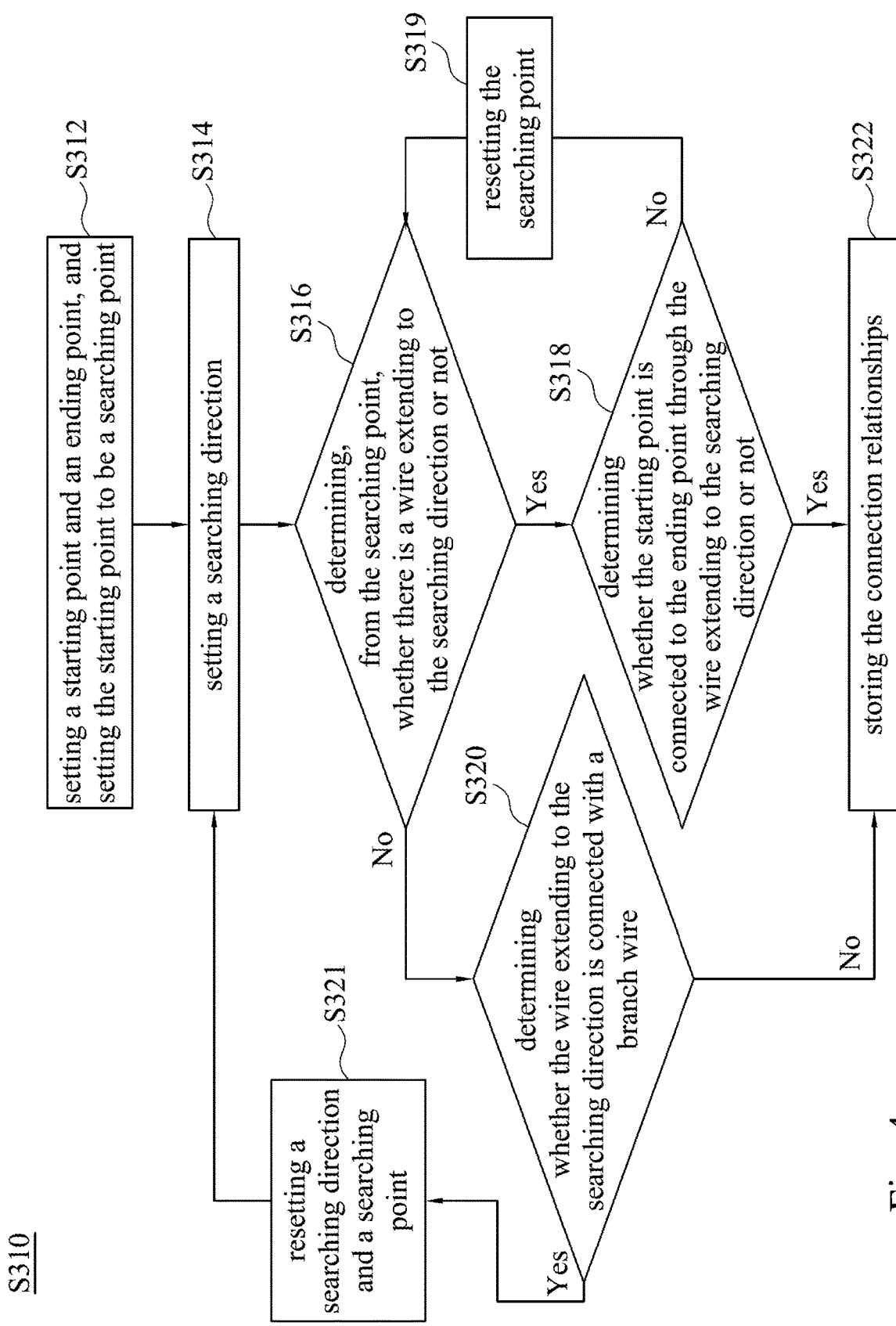
FIG. 4 is a flow chart of one of the operations of the circuit comparing method according to some embodiments of the present disclosure.

Reference is made to FIG. 4. FIG. 4 is a flow chart of operation S310 of the circuit comparing method 300 in FIG. 3 according to some embodiments of the present disclosure. In some embodiments, operation S310 includes the following operations:

Operation S312: setting a starting point and an ending point, and setting the starting point to be a searching point;

Operation S314: setting a searching direction;

Operation S316: determining, from the searching point, whether there is a wire extending to the searching direction or not;

Operation S318: determining whether the starting point is connected to the ending point through the wire extending to the searching direction or not;

Operation S319: resetting the searching point;

Operation S320: determining whether the wire extending to the searching direction is connected with a branch wire:

Operation S321: resetting a searching direction and a searching point; and

Operation S322: storing the connection relationships.

In order to make the operation S310 of the embodiments of the present disclosure easy to understand, reference is made to FIG. 1, FIG. 2A, FIG. 2B, and FIG. 4 at the same time.

In operation S312, setting the starting point and the ending point, and setting the starting point to be the searching point. In some embodiments, operation S312 may be performed by the processor 120. In some embodiments, when setting the searching point, the starting point is set to be the searching point. Reference is made to FIG. 2A. For example, setting pin A5 of the chip 210 to be the starting point S2, setting the power source +5VS to be the ending point E2, and setting the pin A5 to be the searching point.

In some embodiments, the starting point and the ending point may be the pins of the chip 210, the ground point, the power source, the bridging symbol, and so on, but the embodiments of the present disclosure are not limited thereto.

In operation S314, setting a searching direction. In some embodiments, operation S314 may be performed by the processor 120. Reference is made to FIG. 2A. For example, if the pin A5 of the chip 210 is set to be the starting point S2, and the pin A5 of the chip 210 is set to be the searching point, since the pin A5 of the chip 210 is connected to the wire extending to the direction X1, when setting the searching direction, setting the direction X1 to which the wire is extending to be the searching direction.

In operation S316, starting from the searching point, determining whether there is a wire extending to the searching direction. In some embodiments, operation S316 may be performed by processor 120. If the determination result of the operation S316 is that there is a wire extending to the searching direction, and operation S318 is performed. If the determination result of the operation S316 is that there is a wire extending to the searching direction, and operation S320 is performed.

Reference is made to FIG. 2A. For example, if pin A5 of the chip 210 is set to be the starting point S2 and the searching point, and the searching direction is set to be the direction X1. If searching is started from pin A5 of the chip 210, the determination result of the operation S316 is that there is a wire extending to the searching direction L1. However, if pin A5 of the chip 210 is set to be the starting point S2 and the searching direction is set to be the direction X2, the determination result of the operation S316 is that there is no wire extending to the searching direction.

In operation S318, determining whether the starting point is connected to the ending point through the wire extending to the searching direction. In some embodiments, operation S318 may be performed by the processor 120. If the determination result of the operation S318 is that the starting point is connected to the ending point through the wire extending to the searching direction, and operation S322 is performed. If the determination result of the operation S318 is that the starting point is not connected to the ending point through the wire extending to the searching direction, and operation S319 is performed.

Reference is made to FIG. 2A, For example, if the pin A5 of the chip 210 is set to be the starting point S2 and the searching point, the power source +5VS is set to be the ending point E2, and the searching direction is set to be the direction X1, since the pin A5 of the chip 210 is connected to the wire L1 extending to the direction X1, and the pin A5 of the chip 210 is connected to the power source +5VS through the wires L1 and L2, in which the wires L1 and L2 are extending to the direction X1, the determination result of the operation S318 is that the starting point is connected to the ending point through the wire extending to the searching direction, and operation S322 is performed.

For another example, if pin A3 of the chip 210 is set to be the starting point and the searching point, the ground point GND2 is set to be the ending point, and the searching direction is set to be the direction X1, since pin A3 of the chip 210 is not connected to the ground point GND2 through the wire L3 extending to the direction X1, the determination result of the operation S318 is that the starting point is not connected to the ending point through the wire extending to the searching direction, and operation S319 is performed.

In operation S319, resetting the searching point. In some embodiments, operation S319 may be performed by the processor 120. Reference is made to FIG. 2A. For example, if pin A4 of the chip 210 is set to be the starting point S1, the power source +3VS is set to be the ending point E1, and the searching direction is set to be the direction X1, since pin A4 of the chip 210 is connected to the resistor RA through the wire L5 on the direction X1, and the resistor RA is further connected to the power source +3VS through the wire L6, and the resistor RA is not the set ending point, the determination result of the operation S318 is that the starting point is not connected to the ending point through the wire on the searching direction, and operation S319 is performed. In operation S319, resetting the searching point to be the node P1 of the resistor RA. Then operation S316 is performed, determining whether there is a wire extending to the direction X1 starting from the node P1 or not. Since the node P1 of the resistor RA has wire L6 extending to the direction X1, therefore, the determination result of the operation S316 is that there is wire extending to the searching direction, and operation S318 is performed. Since pin A4 of the chip 210 is connected to the power source +3VS through wires L5 and L6, in which wires L5 and L6 are extending to the direction X1 and the resistor RA, the determination result of the operation S318 is that the starting point is connected to the ending point through the wire extending to the searching direction.

In operation S320, determining whether wire extending to the searching direction is connected with a branch wire or not. The direction that the branch wire is extending to is different from the direction that the wire is extending to. In some embodiments, operation S320 may be performed by the processor 120. If the determination result of the operation S320 is that the wire is connected with a branch wire extending to the searching direction, operation S321 is performed. If the determination result of the operation S320 is that the wire is not connected with a branch wire extending to the searching direction, and operation S322 is performed.

Reference is made to FIG. 2A. For example, if pin A5 of the chip 210 is set to be the starting point S2 and the searching point, ground point GND3 is set to be the ending point and the searching direction is set to be the direction X1. The determination result of the operation S318 is that pin A5 of the chip 210 is not connected to the ground point GND3 through the wire extending on the direction X1, and operation S319 is performed. In operation S319, resetting the searching point to be the node P2, in which the node P2 is connected with the wires L1, L2, and the power source +5VS, and operation S316 is performed. In operation S316, since node P2 does not have a wire extending to the direction X1, the determination result of the operation S316 is that there is no wire extending to the searching direction. Operation S320 is performed, determining whether the wire extending to the searching direction is connected with a branch wire. Since wires L1 and L2 are extended to the direction X1, and wires L1 and L2 are connected with wire L7, in which the wire L7 is extending to the direction X3, the determination result of the operation S320 is that the wire extending to the searching direction is connected with a branch wire.

For another example, reference is made to FIG. 2B. FIG. 2B is a schematic diagram of another circuit diagram 200B according to some embodiments of the present disclosure. In the circuit diagram of FIG. 2B, since the wire L1, which is extending to the direction X1, is not connected with wire L7 as illustrated in FIG. 2A, the determination result of the operation S320 is that the wire extending to the searching direction is not connected with a branch wire.

In operation S321, resetting the searching direction and the searching point. In some embodiments, the operation S321 may be performed by the processor 120. For example, reference is made to FIG. 2A, if pin A5 of the chip 210 is set to be the starting point S2 and the searching point, setting the ground point GND3 to be the ending point, and setting the searching direction to be the direction X1, the determination result of the operation S320 is that the wire extending to the searching direction is connected with a branch wire, and operation S321 is performed. In operation S321, resetting the searching direction to be the direction X3, in which the wire L7 is extending on the X3 direction, and resetting the searching point to be the node P3, in which the node P3 is connected with wires L1, L2, and L7.

In operation S322, storing the connection relationships. In some embodiments, the connection relationship may be stored in the memory 140 by the processor 120. The stored connection relationships includes, the starting points, the ending points, the elements and the values of the elements between the starting points and the ending points, but the embodiments of the present disclosure are not limited thereto. For example, if pin A4 of the chip 210 in FIG. 2A is set to be the starting point S1, the power source +3VS is set to be the ending point E1, in operation S322, when storing the connection relationship of the pin A4 of the chip 210 and the power source +3VS in the memory 140, the pin A4 of the chip 210, the power source +3VS, the resistor RA, and the value of the resistor RA are stored in the memory 140. The values of the elements mentioning above include the property value of the elements, the tolerance value of the elements, and the selectivity of the elements, but the embodiments of the present disclosure are not limited thereto.

In some embodiments, since the set starting point and the set ending point are not connected through any wires or elements, the determination result of the operation S320 is that the wire extending to the searching direction is not connected with a branch wire, and operation S322 is performed. In operation S322, the searching result is stored in the memory 140, in which the searching result is that the starting point and the ending point are not connected through any wires or elements.

The flow chart of operation S310 illustrated in FIG. 4 is for illustrative purposes only. Any way to find several connection relationships between the several elements of a circuit diagram are within the scope of the present invention.

Reference is made to FIG. 3 again. In operation S330 detecting and storing several connection relationships of the second circuit diagram between all starting points and all ending points corresponding to all starting points. In some embodiments, operation S330 may be performed by the processor 120. The detailed process of operation S330 is as described above, and will not be described here.

For example, through the operations mentioning above, in circuit diagram 200A of FIG. 2A, pin A4 of the chip 210 is set to be the first starting point S1, the power source +3VS to be the first ending point E1, the pin A5 of the chip 210 is set to be the second starting point S2, and the power source +5VS is set to be the second ending point E2. In circuit diagram 200B of FIG. 2B, pin A4 of the chip 210 is set to be the third starting point S3, the power source +3VS is set to be the third ending point E3, the pin A5 of the chip 210 is set to be the fourth starting point S4, and the power source +5VS is set to be the fourth ending point E4. After setting several starting points and several ending points, detecting a first connection relationship between the first starting point S1 and the first ending point E1, a second connection relationship between the second starting point S2 and the second ending point E2, a third connection relationship between a third starting point S3 and a third ending point E3, and a fourth connection relationship between a fourth starting point S4 and a fourth ending point E4. The starting point and the ending point mentioning above are for illustrative purposes only, and the embodiments of the present disclosure are not limited thereto.

In operation S350, determining at least one difference between several connection relationships of the first circuit diagram and several connection relationships of the second circuit diagram. In some embodiments, operation S350 may be performed by the processor 120. For example, reference is made to FIG. 2A and FIG. 2B. After detecting and storing several connection relationships of the circuit diagram 200A and several connection relationships of the circuit diagram 200B, by comparing several connection relationships of the circuit diagram 200A and several connection relationships of the circuit diagram 200B, determining the differences between the circuit diagram 200A and the circuit diagram 200B. The differences between the circuit diagram 200A and the circuit diagram 200B includes that in circuit diagram 200A, the pin A5, the power source +5VS, and the capacitor C are connected to each other, the capacitor C is further connected to the ground point GND3, and in circuit diagram 200B, there is no ground point GND3 and capacitor C.

In some embodiments, the operation of determining at least one difference between several connection relationships of the first circuit diagram and several connection relationships of the second circuit diagram includes determining whether elements of several connection relationships of the first circuit diagram and elements of several connection relationships of the second circuit diagram are identical or not.

For example, even that pin A4 in each circuit diagram, 200A and 200B, is connected to the power source +3VS through the resistor RA or the resistor RB, but the tolerance/resistance value of the resistor RA and the tolerance/resistance value of the resistor RB are different. That is, the value of the resistor RA and the resistor RB are different.

Reference is made to FIG. 3. In operation S370, outputting at least one difference. In some embodiments, operation S370 may be operated by the processor 120 of FIG. 1. Difference is made to FIG. 2A and FIG. 2B, in operation S370, illustrating the differences between the circuit diagram 200A and circuit diagram 200B in the circuit diagram 200A and/or 200B. For example, areas enclosed by dotted lines in circuit diagram 200A of FIG. 2A and circuit diagram 200B of FIG. 2B are the differences. When outputting the differences, the differences may be marked with colors on the circuit diagrams, marked with dotted lines on the circuit diagrams, or may be presented in a form, but the present disclosure is not limited thereto.

In some embodiments, when the elements of the first circuit diagram and the elements of the second circuit diagram are different, the elements of the first circuit diagram and/or the elements of the second circuit diagram are marked on the first circuit diagram and/or the second circuit diagram. For example, assume that element RA in the circuit diagram 200A is a resistor, and element RB in the circuit diagram 200B is a capacitor, the processor 120 make marks on the element RA and/or the element RB on the circuit diagram 200A and/or the circuit diagram 200B.

In some embodiments, when the elements of the several connection relationships of the first circuit diagram are identical to the elements of the several connection relationships of the second circuit diagram, but the values of the elements of the first circuit diagram are different from the values of the elements of the second circuit diagram, mark the elements of the first circuit diagram and/or the elements of the second circuit diagram on the first circuit diagram and/or the second circuit diagram. For example, even that pin A4 in each circuit diagram, 200A and 200B, is connected to the power source +3VS through the resistor RA or the resistor RB, but the tolerance/resistance value of the resistor RA and the resistor RB are different, that is, the value of the resistor RA and the resistor RB are different. The processor 120 make marks on the resistor RA and/or the resistor RB of the circuit diagram 200A and/or the circuit diagram 200B.

In some embodiments, the differences between the circuit diagrams may be divided into major differences and minor differences, and major differences and minor differences are presented in different ways. For example, consider the differences in the connection method between all starting points and all ending points corresponding to the starting points in different circuit diagrams as the main difference, and consider the differences in the values of the elements as the minor difference, then the main differences are marked with a first color on the circuit diagram, while the minor differences are marked with the a second color on the circuit diagram.

It may be seen from the embodiments of the present disclosure mentioning above, the embodiments of the present disclosure provide a circuit comparing method and an electronic device, more particularly, a circuit comparing method and an electronic device for comparing the connection relationships between elements, so as to compare the different design circuit diagrams more accurately, quickly, and more completely, and to allow the circuit designer to quickly know the differences between the circuit diagrams.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A circuit comparing method, comprising:
    detecting, by a processor, all starting points of a first circuit diagram, and searching all ending points along a plurality of searching directions from the all starting points;
    collecting, by a processor, all elements connecting between each of the all starting points and a corresponding one of the all ending points of the first circuit diagram;
    detecting, by the processor, all starting points of a second circuit diagram, and searching all ending points along a plurality of searching directions from the all starting points;
    collecting, by a processor, all elements connecting between each of the all starting points and a corresponding one of the all ending points of the second circuit diagram;
    comparing, by the processor, the all elements of the first circuit diagram with the all elements of the second circuit diagram;
    determining, by the processor, at least one difference between the all elements of the first circuit diagram and the all elements of the second circuit diagram; and
    marking, by the processor, one of the all elements of the first circuit diagram different from a corresponding one of the all elements of the second circuit diagram.

2. The circuit comparing method of claim 1, wherein detecting, by the processor, all starting points of the first circuit diagram, searching the all ending points along the plurality of searching directions from the all starting points, and collecting the all elements between each of the all starting points and the corresponding one of the all ending points of the first circuit diagram comprises:
    detecting a first starting point, searching a first ending point along a first searching direction, and collecting a first element between the first starting point and the first ending point of the first circuit diagram; and
    detecting a second starting point, searching a second ending point along a second searching direction, and collecting a second element between the second starting point and the second ending point of the first circuit diagram; and
    wherein detecting, by the processor, all starting points of the second circuit diagram, searching the all ending points along the plurality of searching directions from the all starting points, and collecting the all elements between each of the all starting points and the corresponding one of the all ending points of the second circuit diagram comprises:
    detecting a third starting point, searching a third ending point along a third searching direction, and collecting a third element between the third starting point and the third ending point of the second circuit diagram; and
    detecting a fourth starting point, searching a fourth ending point along a fourth searching direction to find, and collecting a fourth element between the fourth starting point and the fourth ending point of the second circuit diagram.

3. The circuit comparing method of claim 1, wherein determining, by the processor, the at least one difference between the all elements of the first circuit diagram and the all elements of the second circuit diagram and marking, by the processor, the one of the all elements of the first circuit diagram different from the corresponding one of the all elements of the second circuit diagram comprises:
    determining whether the all elements of the first circuit diagram and the all elements of the second circuit diagram are identical;
    making a mark on the one of the all elements of the first circuit diagram or the corresponding one of the all elements of the second circuit diagram when a type of the one of the all elements of the first circuit diagram and a type of the corresponding one of the all elements of the second circuit diagram are different.

4. The circuit comparing method of claim 3, further comprising:
    when the type of the one of the all elements of the first circuit diagram and the type of the corresponding one of the all elements of the second circuit diagram are identical, determining whether a value of the one of the all elements and a value of the corresponding one of the all elements are equal or not;

making the mark on the one of the all elements of the first circuit diagram or the corresponding one of the all elements of the second circuit diagram when the value of the one of the all elements of the first circuit diagram and the value of the corresponding one of the all elements of the second circuit diagram are different.

5. The circuit comparing method of claim 1, wherein marking, by the processor, the one of the all elements of the first circuit diagram different from the corresponding one of the all elements of the second circuit diagram comprises:

marking the one of the all elements of the first circuit diagram and the corresponding one of the all elements of the second circuit diagram with a plurality of colors.

6. The circuit comparing method of claim 1, wherein the starting points and the ending points each comprises a pin of the chips, a ground point, a power source or a bridging symbol.

7. An electronic device, comprising:
a memory, configured to store a first circuit diagram and a second circuit diagram; and
a processor coupled to the memory and detecting all starting points of a first circuit diagram, and searching all ending points along a plurality of searching directions from the all starting points, collecting all elements connecting between each of the all starting points and a corresponding one of the all ending points of the first circuit diagram, detecting all starting points of a second circuit diagram, and searching all ending points along a plurality of searching directions from the all starting points, collecting all elements connecting between each of the all starting points and a corresponding one of the all ending points of the second circuit diagram, comparing the all elements of the first circuit diagram with the all elements of the second circuit diagram to determine at least one difference between the all elements of the first circuit diagram and the all elements of the second circuit diagram, and marking one of the all elements of the first circuit diagram different from a corresponding one of the all elements of the second circuit diagram.

8. The electronic device of claim 7, wherein the processor is configured to collect a first element between a first starting point and a first ending point of the first circuit diagram, to collect a second element between a second starting point and a second ending point of the first circuit diagram, the processor is further configured to collect a third element between a third starting point and a third ending point of the second circuit diagram, and to collect a fourth element between a fourth starting point and a fourth ending point of the second circuit diagram; and the memory is configured to store the first element, the second element, the third element, and the fourth element.

9. The electronic device of claim 7, wherein the processor is further configured to determine whether the all elements of the first circuit diagram and the all elements of the second circuit diagram are identical or not, the processor is further configured to make a mark on the one of all elements of the first circuit diagram or the corresponding one of all elements of the second circuit diagram when a type of the one of the all elements of the first circuit diagram and a type of the corresponding one of the all elements of the second circuit diagram are different.

10. The electronic device of claim 9, wherein when the type of the one of the all elements of the first circuit diagram and the type of the corresponding one of the all elements of the second circuit diagram are identical, the processor determines whether a value of the one of the all elements and a value of the corresponding one of the all elements are identical or not, the processor is further configured to make the mark on the one of the all elements of the first circuit diagram or the corresponding one of the all elements of the second circuit diagram when the value of the one of the all elements of the first circuit diagram and the value of the corresponding one of the all elements of the second circuit diagram are different.

11. The electronic device of claim 7, wherein the processor is configured to mark the one of the all elements of the first circuit diagram and the corresponding one of the all elements of the second circuit diagram with a plurality of colors.

12. The electronic device of claim 7, wherein the starting points and the ending points each comprises a pin of the chips, a ground point, a power source or a bridging symbol.

* * * * *